(12) United States Patent
Wong et al.

(10) Patent No.: US 7,749,890 B2
(45) Date of Patent: Jul. 6, 2010

(54) LOW CONTACT RESISTANCE METAL CONTACT

(75) Inventors: Keith Kwong Hon Wong, Wappingers Falls, NY (US); Chih-Chao Yang, Glenmont, NY (US); Haining S. Yang, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/464,348

(22) Filed: May 12, 2009

(65) Prior Publication Data

US 2009/0218695 A1    Sep. 3, 2009

Related U.S. Application Data

(62) Division of application No. 11/692,227, filed on Mar. 28, 2007, now Pat. No. 7,566,651.

(51) Int. Cl.
*H01L 21/4763* (2006.01)

(52) U.S. Cl. .................. 438/621; 438/154; 257/288; 257/347

(58) Field of Classification Search .............. 257/288, 257/347; 438/154, 621
See application file for complete search history.

(56) References Cited

U.S. PATENT DOCUMENTS

| | | | |
|---|---|---|---|
| 5,306,950 A | 4/1994 | Fujikawa et al. | |
| 5,635,764 A | 6/1997 | Fujikawa et al. | |
| 6,025,634 A | 2/2000 | Teong | |
| 6,239,015 B1 | 5/2001 | Jung | |
| 6,271,122 B1 | 8/2001 | Wieczorek et al. | |
| 6,274,471 B1 | 8/2001 | Huang | |
| 6,677,230 B2 | 1/2004 | Yokoyama et al. | |
| 6,710,413 B2 | 3/2004 | Thei et al. | |
| 6,753,606 B2 | 6/2004 | Cabral, Jr. et al. | |
| 6,815,820 B2 | 11/2004 | Yu et al. | |
| 6,936,487 B2 | 8/2005 | Ikeda et al. | |
| 7,098,128 B2 | 8/2006 | Collins et al. | |
| 7,405,112 B2* | 7/2008 | Besser | 438/154 |
| 2003/0219965 A1 | 11/2003 | Cabral, Jr. et al. | |
| 2005/0280027 A1 | 12/2005 | Ikeda et al. | |
| 2006/0068545 A1 | 3/2006 | Goldbach | |
| 2008/0116494 A1* | 5/2008 | Goldbach et al. | 257/288 |
| 2008/0179688 A1* | 7/2008 | Thei et al. | 257/369 |

FOREIGN PATENT DOCUMENTS

JP   06-112157   4/1994
JP   2002-176010   6/2002

* cited by examiner

*Primary Examiner*—Thanh V Pham
*Assistant Examiner*—Caleb Henry
(74) *Attorney, Agent, or Firm*—Joseph P. Abate; Roberts Mlotkowski Safran & Cole, P.C.

(57) ABSTRACT

A semiconductor structure and methods of making the same. The semiconductor structure includes a substrate having a silicide region disposed above a doped region, and a metal contact extending through the silicide region and being in direct contact with the doped region.

13 Claims, 10 Drawing Sheets

US 7,749,890 B2

LOW CONTACT RESISTANCE METAL CONTACT

CROSS REFERENCE TO RELATED APPLICATIONS

The present application is a divisional application of U.S. patent application Ser. No. 11/692,227, filed on Mar. 28, 2007, the contents of which are incorporated herein by reference in their entirety.

FIELD OF THE INVENTION

The invention generally relates to integrated circuit design and fabrication and, more particularly, to a semiconductor structure having improved contact resistance and methods of making the same.

BACKGROUND OF THE INVENTION

Semiconductor device performance is dependent upon numerous factors, one being the total device resistance. The total device resistance is, in turn, a function of parameters such as contact resistance, wiring resistance, channel resistance, etc. Decreasing the total device resistance can improve device performance (i.e., improve device speed).

As CMOS devices scale further downward, the contact resistance becomes a higher portion of the total resistance due to the fact that channel resistance decreases while metal contact resistance increases with the scaling trend. The contact resistance is dictated by the contact area, barrier height, and silicon doping concentration. However, contact area is constrained by any given scaling rule, and doping concentration is already at a maximum level in current CMOS technology. The barrier height of metal contacts, however, remains a viable avenue for improvements in contact resistance.

One type of material commonly employed in fabricating metal contacts is metal silicides, such as Cobalt silicide or Nickel silicide. Cobalt silicide, and other metal silicides, are typically fabricated using a conventional self-aligned silicide (salicide) process, wherein a blanket TiN/Co film is deposited over the devices and annealed to form Cobalt monosilicide over the exposed silicon regions (source, drain and gate) of transistors. A selective wet etch is employed to remove the TiN cap and the non-reacted Cobalt left over the oxide or nitride regions. The Cobalt monosilicide is then subjected to a second anneal which converts the monosilicide into a Cobalt disilicide layer. Such Cobalt silicides and Nickel silicides are referred to as mid-gap metals because their workfunction is between the workfunction of n-type and p-type semiconductors. They can be used as a contact metal for both n-type and p-type devices with certain contact resistance.

In know structures, a contact stud is formed over the silicide contact by first etching a trench through an interlayer dielectric (and, possibly, through an optional etch stop nitride layer) to the top surface of the silicide contact. The trench is subsequently filled with metal (e.g., tungsten by CVD, or copper by electroplating) to form a contact stud that is in direct contact with the silicide contact.

To further reduce total resistance, it has been suggested to use different silicide materials for the respective n-type and p-type areas of a circuit. However, this is generally not a financially suitable solution since it adds many additional processing steps to the overall fabrication scheme.

Accordingly, there exists a need in the art to overcome the deficiencies and limitations described hereinabove.

SUMMARY OF THE INVENTION

In a first aspect of the invention, there is a semiconductor structure comprising a substrate comprising a silicide region disposed above a doped region, and a metal contact extending through the silicide region and being in direct contact with the doped region.

In a second aspect of the invention, there is a method comprising providing a substrate comprising a silicide layer above a doped region, forming a trench through the silicide layer to expose a surface of the doped region, and forming a silicide contact on the surface of the doped region.

In a third aspect of the invention, there is a method comprising forming a mask over a first portion of a dielectric material, and removing a section of the dielectric material from a second portion of the dielectric material not covered by the mask. The method further comprises forming a first trench through the first portion of the dielectric material to a first silicide layer disposed above a first doped region. A second trench is formed through the second portion of the dielectric material and through a second silicide layer, thereby exposing a surface of a second doped region. A silicide contact is formed on the surface of the second doped region.

In another aspect of the invention, a semiconductor structure comprises: a substrate comprising a silicide region formed above a doped region; a nitride layer formed over the silicide region; an interlayer dielectric formed over the nitride layer; a metal contact extending through the interlayer dielectric, the nitride layer, and the silicide region and in direct contact with the doped region, wherein the metal contact comprises a low contact resistance silicide differing in composition from the silicide region and a contact stud in direct contact with the low contact resistance silicide; a second silicide region disposed above a second doped region; an isolation structure between the doped region and the second doped region; and a second metal contact extending through the interlayer dielectric and the nitride layer, and in contact with the second silicide region, wherein the doped region comprises n-type semiconductor material, the low contact resistance silicide comprises one of Erbium and Ytterbium, and the second doped region comprises p-type semiconductor material.

DETAILED DESCRIPTION OF EMBODIMENTS OF THE INVENTION

The invention is directed to semiconductor devices and methods of making the same. More particularly, aspects of the invention provide semiconductor devices in which the contact resistance is improved by reducing the barrier height of the contact. This is achieved, in embodiments, by exposing doped semiconductor material at the bottom of the contact trench and forming low contact resistance silicide directly onto the doped semiconductor material. In this manner, the barrier height of the contact is reduced, thereby reducing the contact resistance and improving device performance.

Figure 1:
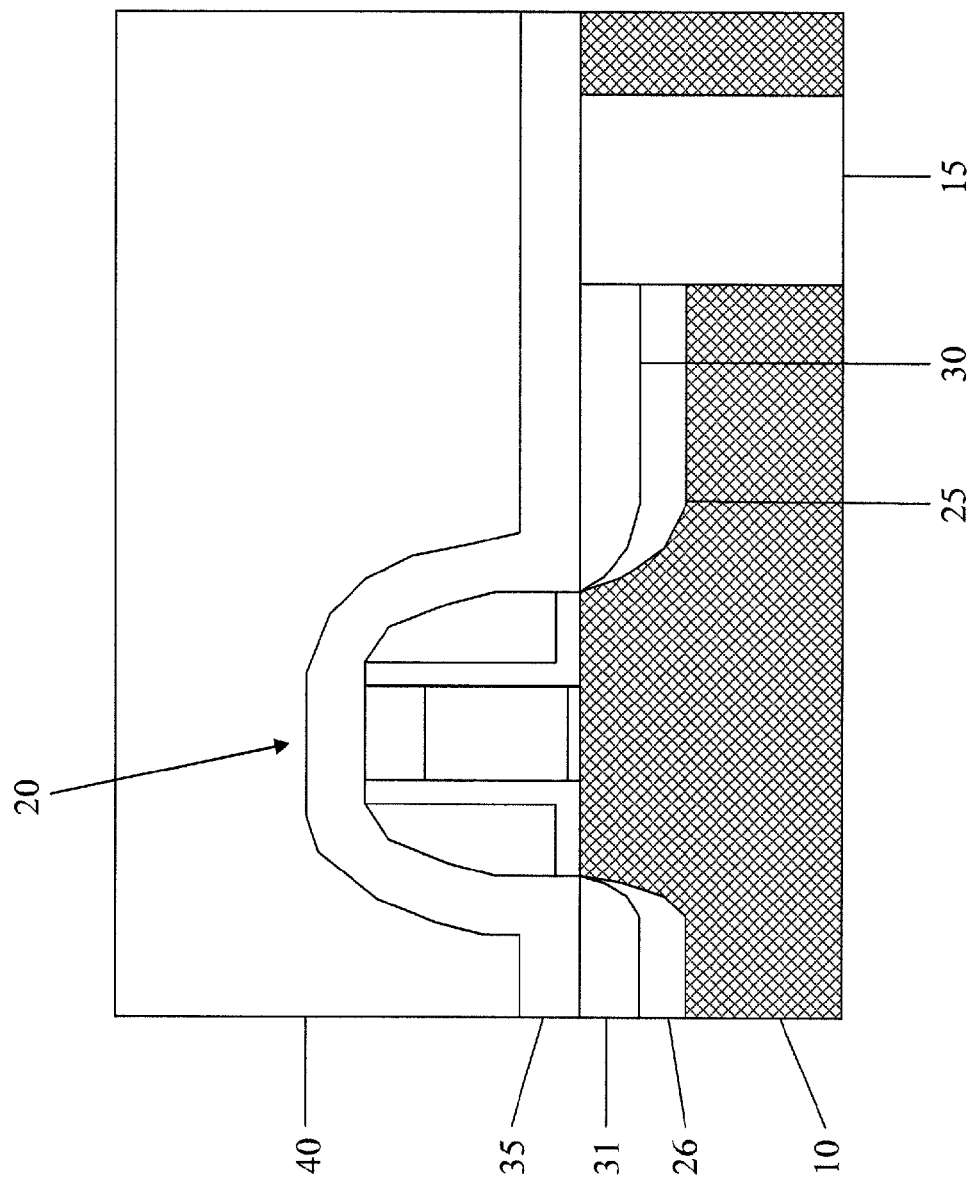
FIGS. 1 through 5 show process steps and intermediate structures according to aspects of the invention.

FIG. 1 shows an intermediate structure during the fabrication of a semiconductor device. The intermediate structure comprises a substrate 10, shallow trench isolation (STI) 15, and a conventional type gate 20. Formed on either side of the gate 20, and within the substrate, are doped (source/drain) regions 25, 26, and silicide regions 30, 31. Disposed over the silicide regions 30, 31 and gate 20 are an etch-stop nitride layer 35 and an interlayer dielectric 40. The structure may be either an n-type or p-type structure, depending upon the materials used and the intended application of the finished device.

The intermediate structure of FIG. 1 may be formed in any suitable manner, using conventional processes and materials. For example, the substrate 10 may comprise a semiconductor substrate, which is typically a silicon substrate, a buried oxide (BOX) layer formed on the substrate, and a semiconductor layer, which is typically a silicon layer, formed on the buried oxide layer. The semiconductor layer may be comprised of various semiconductor materials, such as, for example, Si, SiGe, SiC, SiGeC, etc. The substrate 10 may be fabricated using techniques known to those skilled in the art. For example, the substrate 10 may be formed by conventional bonding and cutting processes, or alternatively, a conventional separation by implantation of oxygen (SIMOX) process.

Similarly, techniques known in the art may be utilized to form the STI 15. A conventional technique entails patterning with a photoresist, etching the trench, chemical vapor deposition (CVD) of oxide to fill the trench, and planarizing the surface such as by chemical mechanical polishing (CMP).

Plural STIs 15 may be employed, resulting in the formation of silicon on insulator (SOI) islands. In implementations, each island may accommodate a gate device. For example, a first SOI island may accommodate a p-type device, and a second, possibly adjacent, SOI island may accommodate an n-type device. It is understood, however, that any number of islands may be formed, and any configuration of p-type and n-type devices may be employed.

Still referring to FIG. 1, the gate 20 may comprise a standard gate formed in any conventional manner. For example, the gate 20 may be fabricated by first forming gate dielectric on an exposed surface (e.g., top) of the SOI island. The gate dielectric layer may be formed by a conventional deposition process such as CVD or plasma-assisted CVD, or a thermal growing process such as oxidation, nitridation or oxynitridation. The gate dielectric may include any device quality dielectric material such as an oxide, nitride, oxynitride or any combination and multilayer thereof. The thickness of the gate dielectric is not critical to the present invention.

A gate stack may be formed on the gate dielectric utilizing a conventional deposition process such as CVD, plasma-assisted CVD or plating. The gate stack may include a gate material such as polysilicon, amorphous silicon or other materials suitable for MOSFET gate composition. The gate material may be formed on the surface of the gate dielectric utilizing conventional deposition processes well known in the art such as, for example, CVD or plasma-assisted CVD. An optional dielectric-capping layer (not shown) may be present atop the gate material. When present, the optional dielectric-capping layer may typically be comprised of an oxide, nitride or oxynitride and formed utilizing a conventional deposition process such as, for example, CVD or plasma-assisted CVD. Alternatively, a conventional thermal growing process such as, for example, oxidation, may be used in forming an optional dielectric-capping layer.

Following formation of the gate stack on the gate dielectric layer, the gate stack and gate dielectric layer may be subjected to a conventional patterning process which includes lithography and etching steps. By way of example, the lithography step may entail applying a photoresist, exposing the photoresist to a pattern of radiation, and developing the pattern utilizing a conventional resist developer. Following the lithography step, a conventional etching process such as reactive-ion etching, plasma etching, ion beam etching or laser ablation may be employed in transferring the pattern to the gate stack and the gate dielectric.

Spacers may be formed along gate sidewalls. For example, spacer material such as a nitride (e.g., $Si_3N_4$) may be deposited in a conventional manner, such as by chemical vapor deposition (CVD) using a silane source. Other techniques, which may be suitable for deposition of a nitride layer, include low-pressure CVD (LPCVD) and atmospheric pressure (CVD) (APCVD). Portions of the deposited nitride layer are subsequently etched away in a conventional manner to form the spacers.

Still referring to FIG. 1, the doped (source/drain) regions 25, 26 may be formed in a conventional manner. For example, a conventional implantation or out-diffusion process may be employed to selectively dope the source and drain regions with appropriate ions known to those of skill in the art.

Silicide regions 30, 31 may be formed over the doped (source/drain) regions 25, 26 in any suitable manner. For example, the silicide regions 30, 31 may be formed by selectively sputtering a Cobalt (or Nickel) film onto the source and drain regions 25, 26, and annealing the film to form a Cobalt (or Nickel) silicide, In embodiments, the silicide has a thickness of about 20 nm to 40 nm, although other thicknesses may be used within the scope of the invention.

Etch stop nitride layer 35 and interlayer dielectric 40 may also be formed using conventional techniques and materials. For example, the etch stop nitride layer may be formed by any suitable deposition method. The interlayer dielectric 40 may be composed of silicon dioxide formed from silane and nitrogen sub-oxide by plasma-assisted CVD with high density plasmas.

Figure 2:
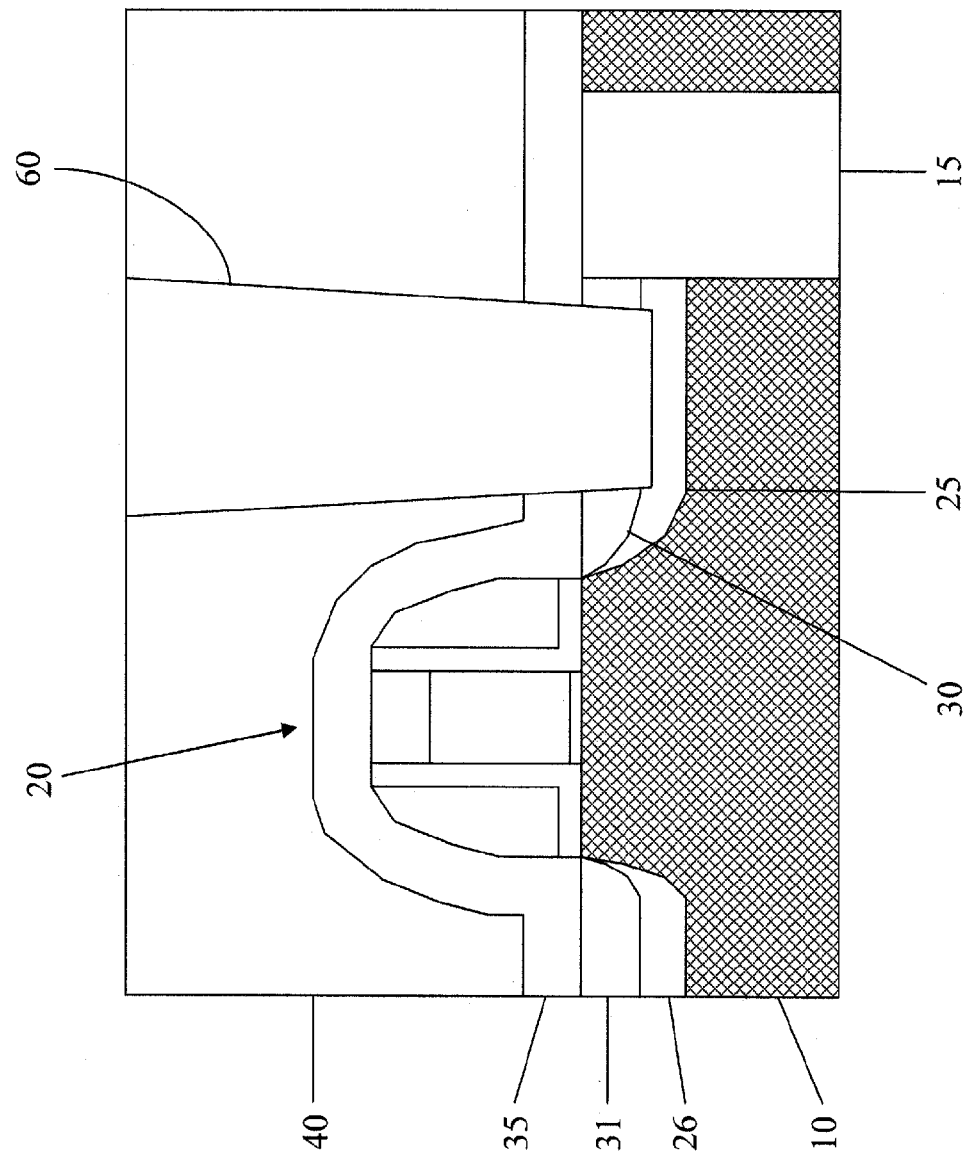

Embodiments of the invention provide an improved contact resistance by reducing the barrier height of the contact region. For example, as shown in FIG. 2, a trench 60 may be formed to extend not only through the interlayer dielectric 40 and etch stop nitride 35, but also through the silicide region 30 to the top of the doped (source/drain) region 25. The trench 60 preferably only extends through the silicide region 30 to expose the top surface of the doped (source/drain) region 25, but may be over-etched (i.e. extend slightly into the doped region 25) to ensure that no silicide remains in the bottom of the trench 60. The trench 60 may be formed using a conventional reactive ion etch (RIE).

Figure 3:
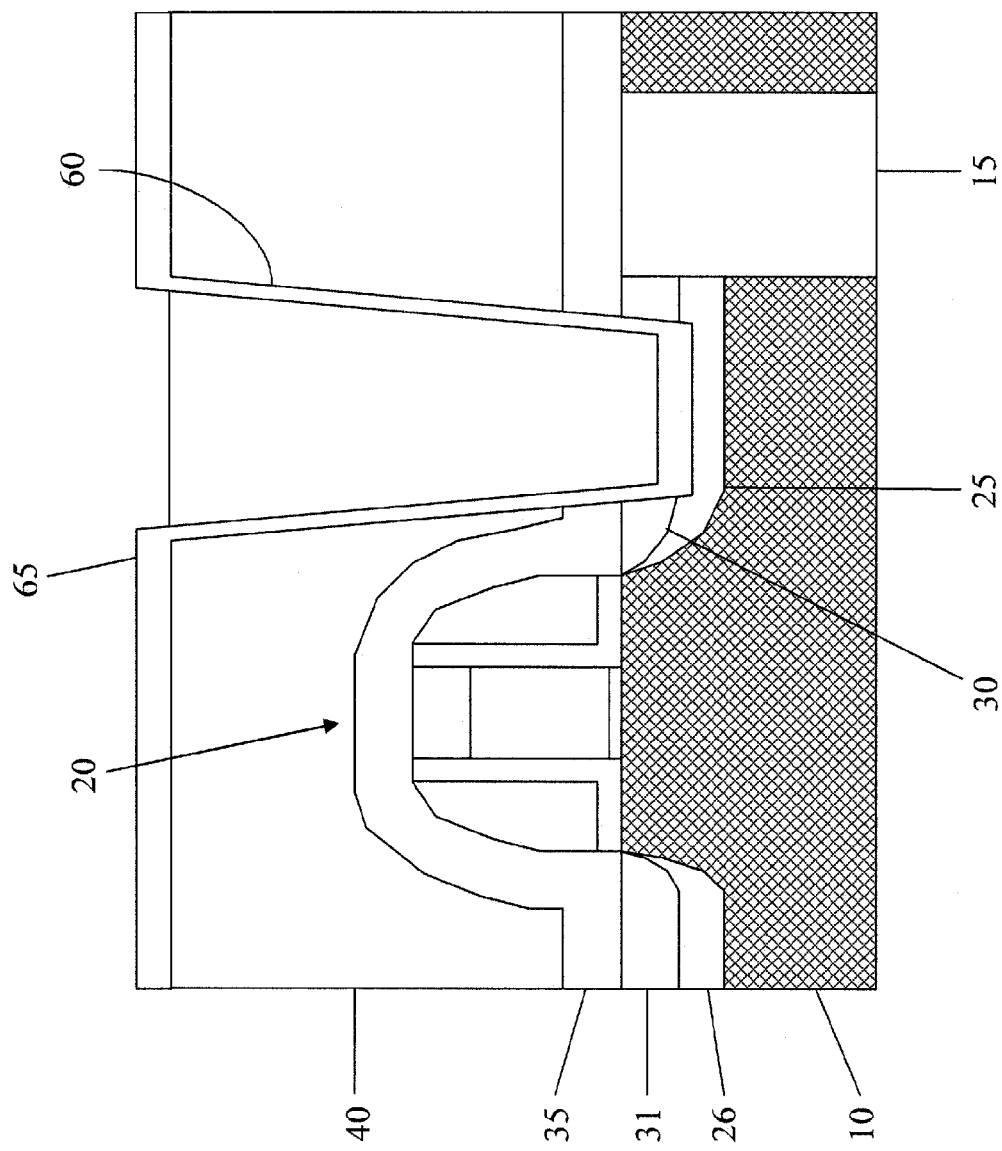

In implementations, after formation of the trench 60, a layer 65 of metal is deposited onto the exposed portions of the structure, as shown in FIG. 3. For example, a conventional sputtering process may be used to deposit the layer 65. In embodiments, the layer 65 has a thickness of about 10 nm to 50 nm, although other thicknesses may be employed.

According to aspects of the invention, the metal that is deposited to form layer 65 is chosen based upon the type of device being created. For example, for PFET's where the doped (source/drain) region 25 comprises p-type semiconductor material, the layer 65 may comprise Platinum (Pt) or Iridium (Ir). For NFET's where the doped (source/drain) region 25 comprises n-type semiconductor material, the layer 65 may comprise Erbium (Er) or Ytterbium (Yb).

Figure 4:
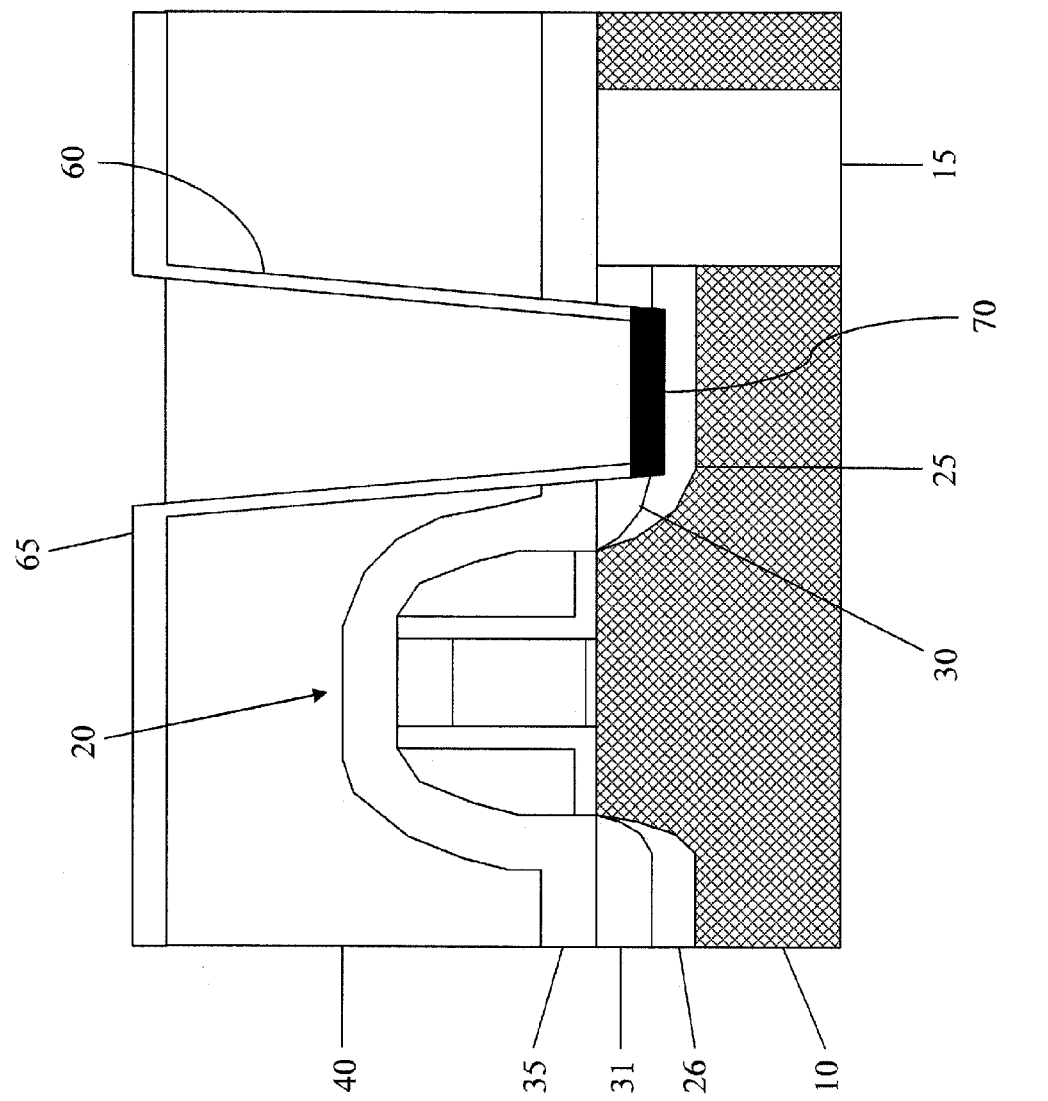

As shown in FIG. 4, the structure is annealed to form a low contact resistance silicide 70 at the bottom of the trench 60 in direct contact with the doped (source/drain) region 25. In implementations, the annealing takes place in an inert gas (e.g., Ar, $N_2$, He, etc.) at a temperature of about 200° C. to 500° C., although other gasses and temperatures may be used.

Moreover, the anneal may be performed singularly or combined with an other anneal step later in the fabrication.

Figure 5:
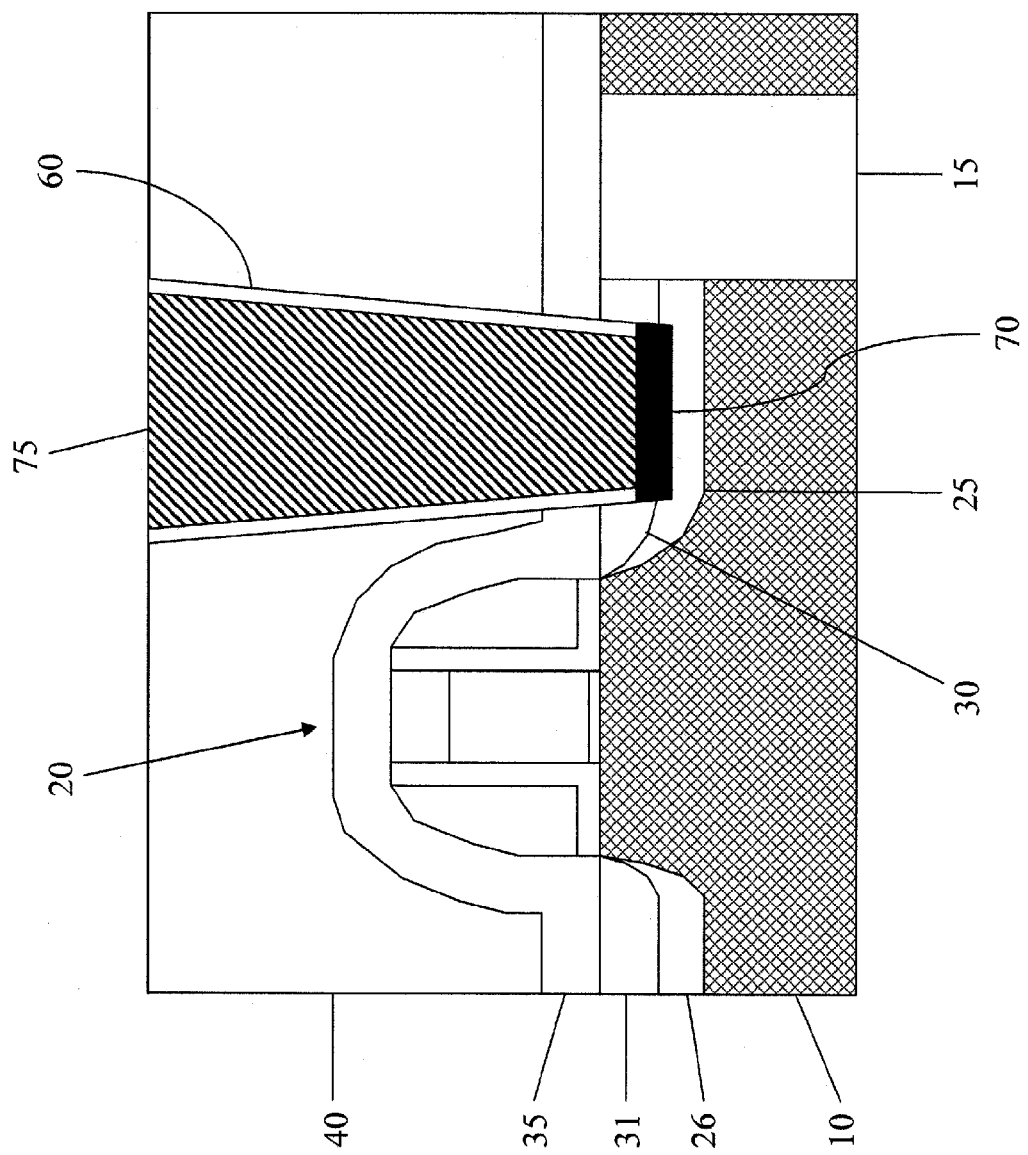

Referring to FIG. 5, desired portions of the non-reacted portions of the layer 65 are stripped using wet chemicals in a conventional salicide (self-aligned-silicide) process. In embodiments, a contact stud 75 is formed in the trench 60 in any suitable known manner, such as, for example, via tungsten deposition or copper electroplating. Unwanted material may be removed and the top surface planarized with a CMP process.

As seen in FIG. 5, the resulting structure has a low contact resistance silicide 70 in direct contact with the doped (source/drain) region 25. When the low contact resistance silicide 70 comprises Erbium (Er) or Ytterbium (Yb) on n-type silicon, the barrier height is reduced to about 0.25 to 0.30 eV, resulting in a contact resistance of about 50 to 80 ohm-μm. This shows a marked improvement over the barrier height and contact resistance of conventional mid-gap metals, thereby providing an improved semiconductor device. The benefit of this process is especially significant when applied on a narrow width device such as an SRAM device where contact area is a significant part of the total source and drain area.

Figure 6:
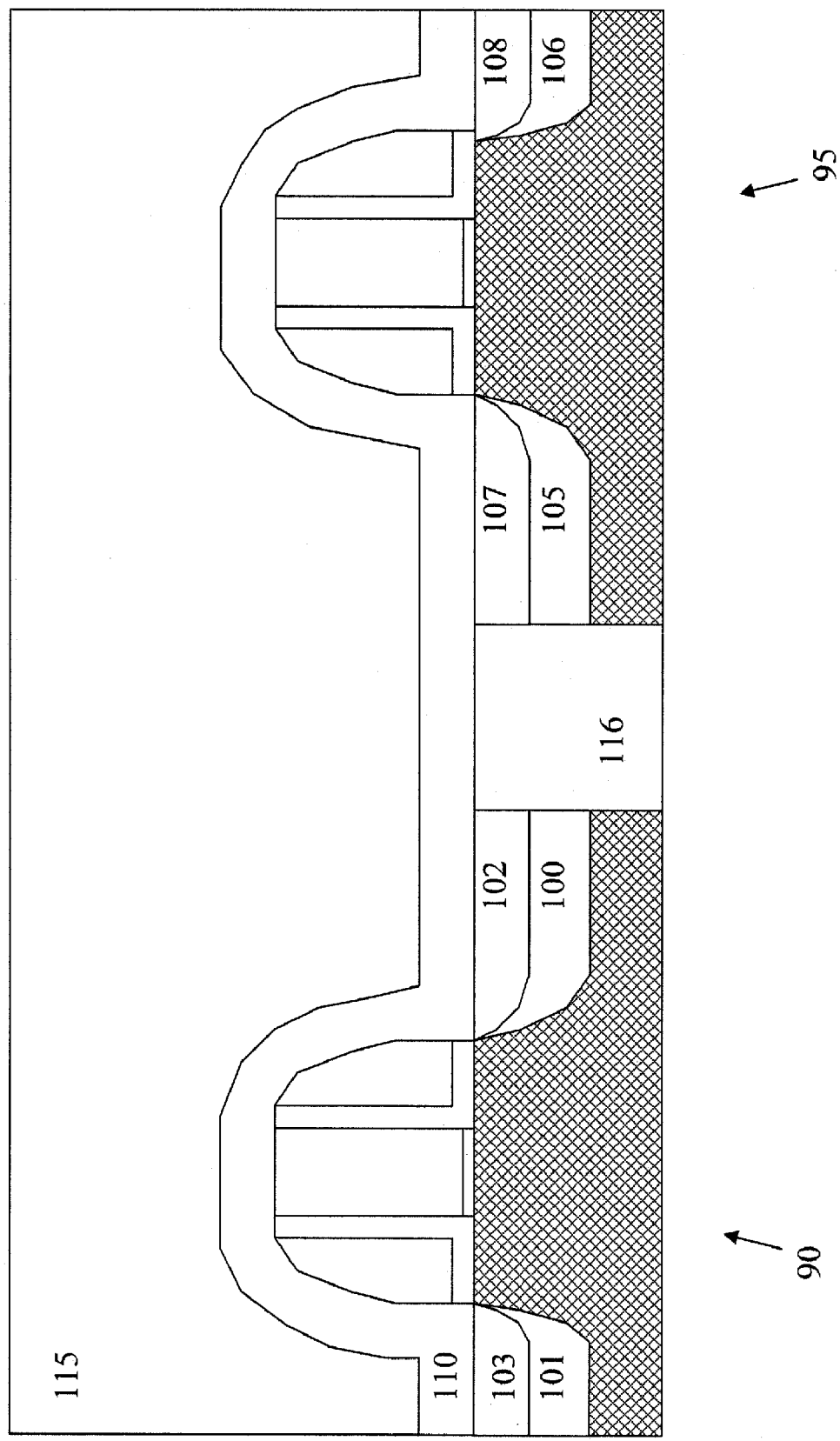
FIGS. 6 through 10 show process steps and intermediate structures according to further aspects of the invention.

FIGS. 6 through 10 show process steps for forming a device according to further aspects of the invention. As shown in FIG. 6, an NFET 90 and a PFET 95 are arranged side-by-side. Similar to the structure shown in FIG. 1, the NFET 90 comprises doped (source/drain) regions 100, 101 and silicide regions 102, 103, and the PFET 95 comprises doped (source/drain) regions 105, 106 and silicide regions 107, 108. A common etch stop nitride 110 and interlayer dielectric 115 may extend over both the NFET 90 and PFET 95, and an STI 116 may be disposed between the NFET 90 and the PFET 95.

Figure 7:
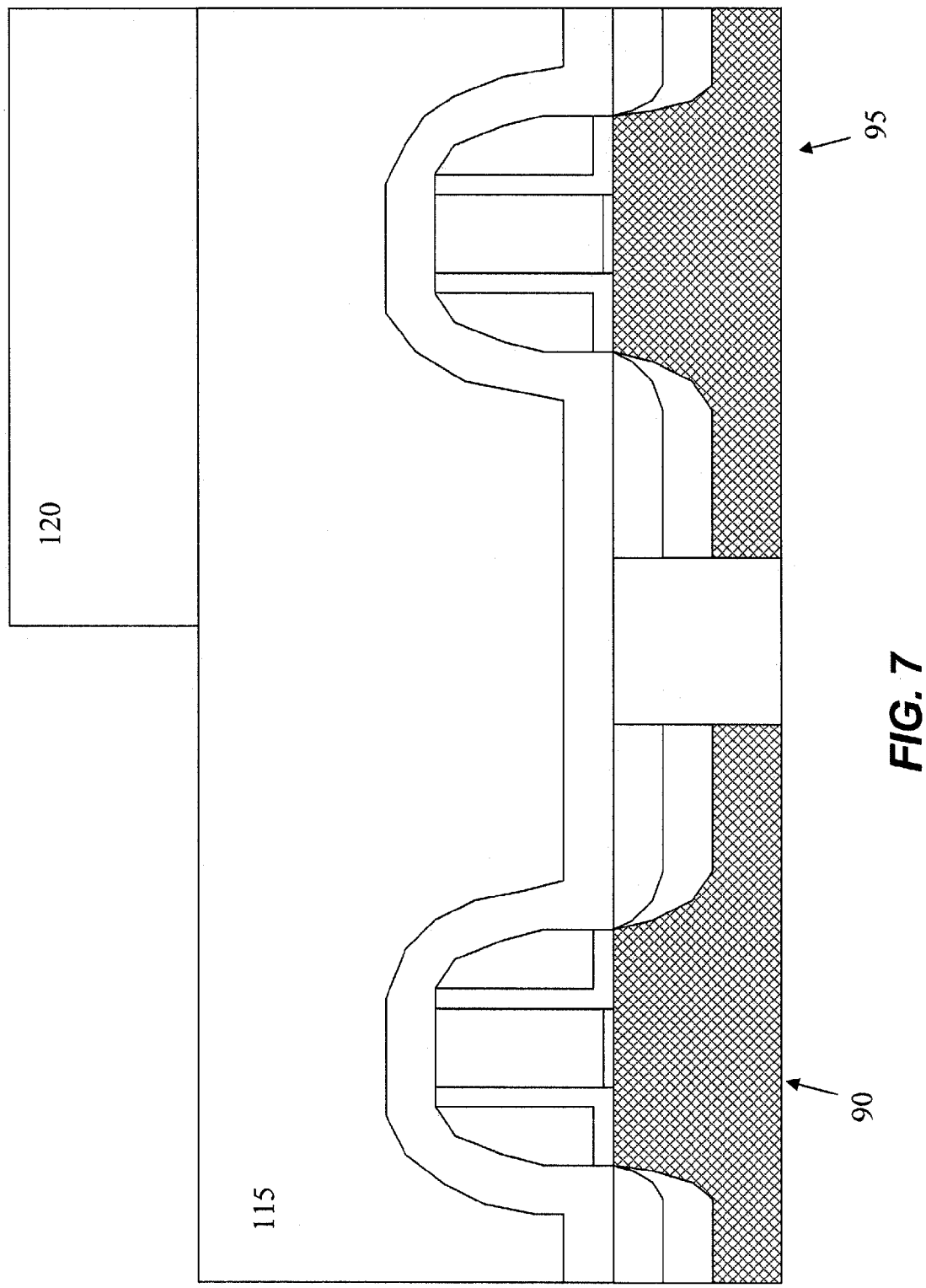
Figure 8:
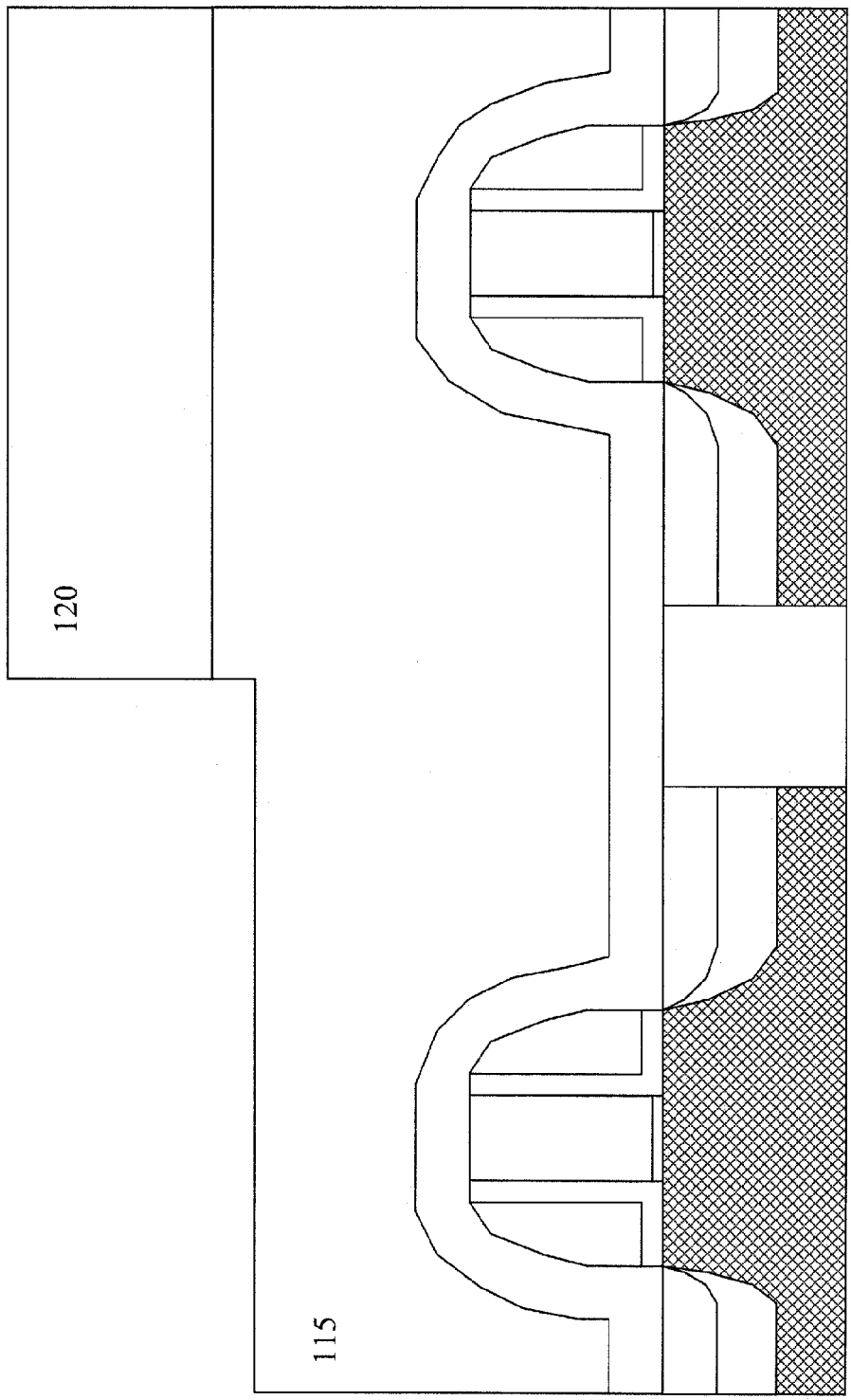

As shown in FIG. 7, a mask (e.g., photoresist) 120 is disposed over the interlayer dielectric 115 above the PFET 95. Any suitable photoresist 120 may be utilized. Then, as depicted in FIG. 8, a section of the interlayer dielectric 115 above the NFET 90 is removed, such as, for example, using a conventional etch process. In embodiments, the depth (i.e., thickness) of the removed section equals or slightly exceeds the depth (i.e., thickness) of the silicide region 102, which, in embodiments, is about 20 nm to 40 nm. After the etch, the mask (e.g., photoresist) 120 is removed using known processes. In alternative embodiments, the mask may be formed over the NFET (instead of the PFET, as described above), thereby effectuating removal of a section of the interlayer dielectric over the PFET.

Figure 9:
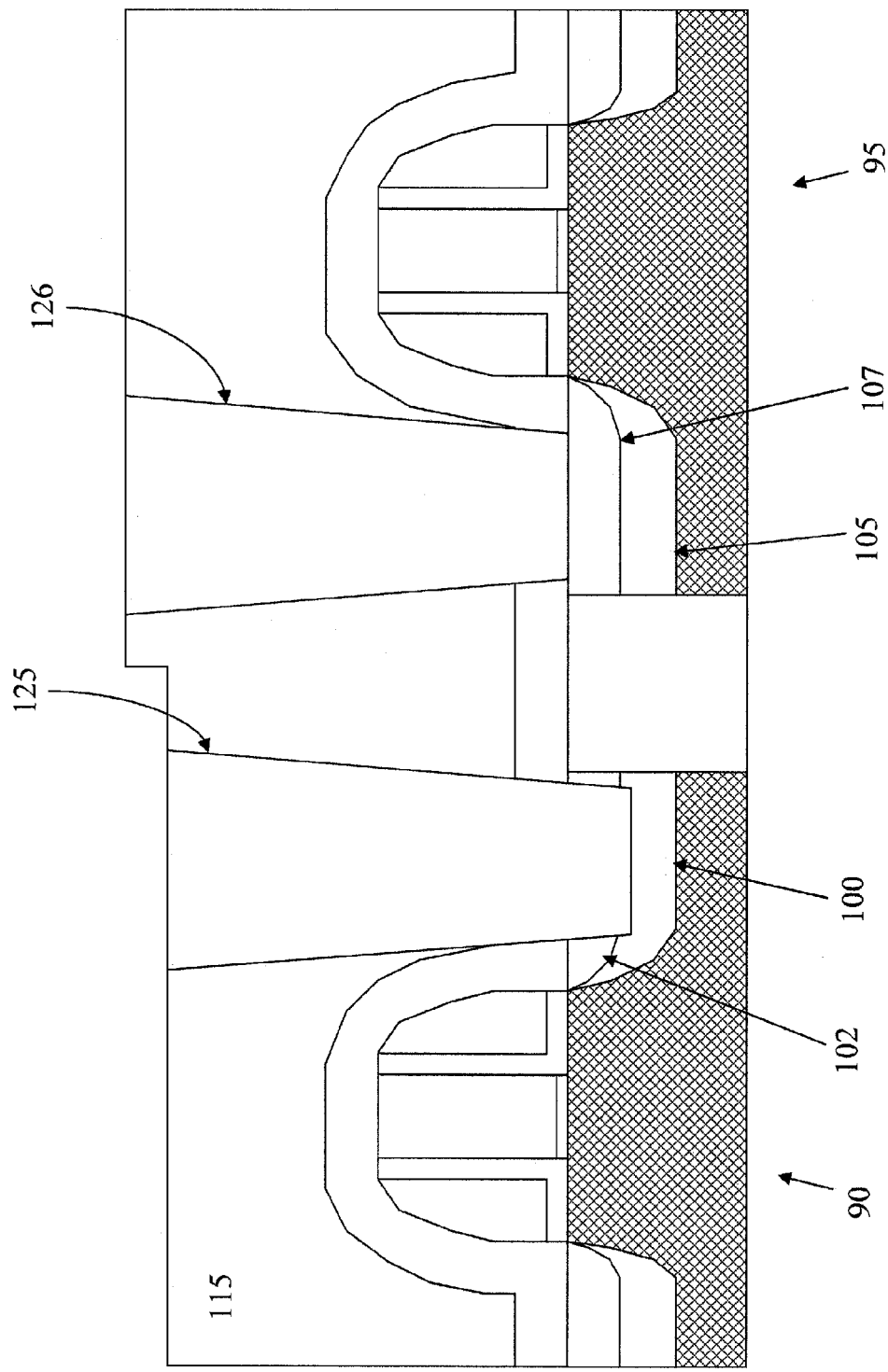

As depicted in FIG. 9, first trench 125 and second trench 126 are formed. In embodiments, the trenches 125, 126 are substantially concurrently formed using a single etch (e.g., RIE) process. Due to the substantially concurrent formation using the common etch, the trenches 125, 126 have substantially the same depth. However, due to the prior removal of a section of the interlayer dielectric 115 above the NFET 90, the first trench 125 extends through silicide region 102 into direct contact with the doped (source/drain) region 100, while second trench 126 extends to the top of, or slightly into, the silicide region 107.

Figure 10:
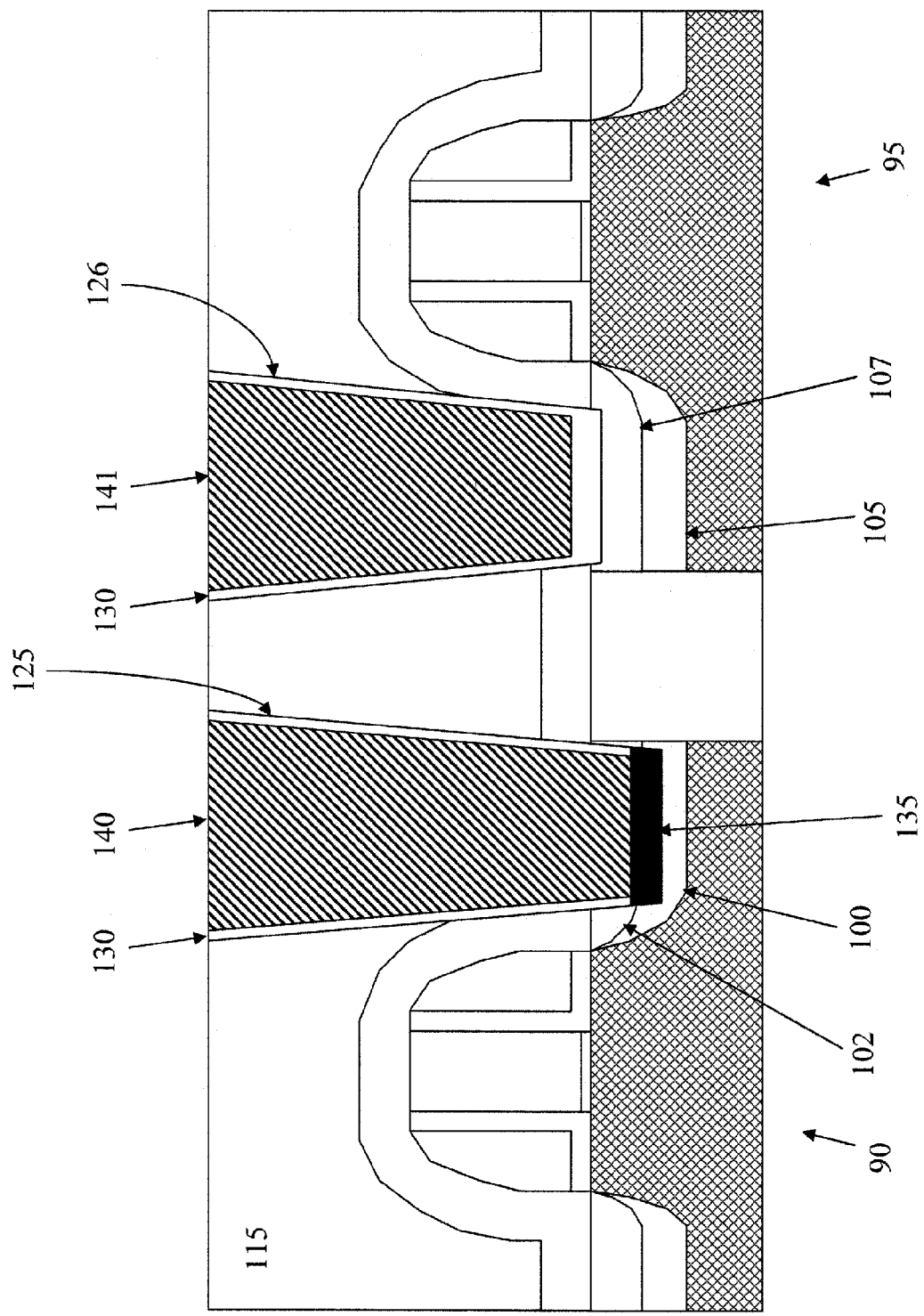

Referring to FIG. 10, in embodiments, a layer 130 of metal is formed on the exposed surfaces of the structure, such as, for example, by a sputtering process similar to that described with respect to FIG. 3. In this manner, the bottoms of both trenches 125, 126 are substantially concurrently covered with a layer 130 of deposited metal. In the example shown, because the NFET 90 has its trench 125 in direct contact with the doped (source/drain) region 100, the layer 130 preferably comprises either Er or Yb. In alternative embodiments, where the PFET has its trench extending into direct contact with the doped (source/drain) region and the NFET does not, the layer of metal preferably comprises either Pt or Ir. In either case, the layer 130 has a thickness of about 10 nm to 50 nm, although other thickness and materials may be used within the scope of the invention.

FIG. 10 shows the structure after an annealing step, which may be similar to that described with respect to FIG. 4. The annealing results in the formation of a low contact resistance silicide 135 at the base of the first trench 125 in direct contact with the doped (source/drain) region 100. The rest of layer 130 remains un-reacted by the anneal. Thus, a new silicide is not formed at the base of the second trench 126 during the anneal.

FIG. 10 further depicts the metal contact studs 140, 141 formed in the trenches 125, 126, The contact studs 140, 141 may be formed substantially concurrently using a common deposition process (e.g., for Tungsten) or electroplating step (e.g., for Copper). Lastly, the top surface of the structure may be planarized using a CMP.

The resulting structure, shown in FIG. 10, has a low contact resistance silicide contact 135 at the NFET 90 and a conventional mid-gap contact formed at the PFET 95. In this manner, the NFET 90 is provided with an improved (i.e., reduced) contact resistance. Moreover, because the contact assemblies for the NFET 90 and PFET 95 are formed using common etching, sputtering, annealing, and metal fill steps, the improvement provided to the NFET 90 does not require as many extra steps as would normally be required in implementing different silicide materials for the respective n-type and p-type areas.

The semiconductor device as described above may be part of the design for an integrated circuit chip. In embodiments, the chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While the invention has been described in terms of embodiments, those skilled in the art will recognize that the invention can be practiced with modifications and in the spirit and scope of the appended claims.

What is claimed:

1. A semiconductor structure, comprising:
   a substrate comprising a silicide region formed above a doped region; and
   a metal contact extending through the silicide region and having a low contact resistance silicide in direct contact with the doped region, the metal contact further including a metal liner lining a sidewall of an interlevel dielectric and a contact stud in contact with the low contact resistance silicide.

2. The semiconductor structure of claim 1, wherein the low contact resistance silicide differs in composition from the silicide region.

3. The semiconductor structure of claim 2, the contact stud is in direct contact with the metal liner of the metal contact.

4. The semiconductor of claim 3, wherein the contact stud extends through the interlayer dielectric and a nitride layer.

5. The semiconductor structure of claim 1, wherein:
   the silicide region comprises one of Cobalt silicide and Nickel silicide, and
   the low contact resistance silicide of the metal contact comprises one of Platinum silicide, Iridium silicide, Erbium silicide, and Ytterbium silicide.

6. The semiconductor structure of claim 1, further comprising:
   a second silicide region disposed above a second doped region; and
   an isolation structure between the doped region and the second doped region.

7. The semiconductor structure of claim 6, wherein:
   the doped region comprises n-type semiconductor material,
   the metal contact comprises one of Erbium silicide and Ytterbium silicide, and
   the second doped region comprises p-type semiconductor material.

8. The semiconductor structure of claim 6, wherein:
   the doped region comprises p-type semiconductor material,
   the metal contact comprises one of Platinum silicide and Iridium silicide, and
   the second doped region comprises n-type semiconductor material.

9. A semiconductor structure, comprising:
   a substrate comprising a silicide region formed above a doped region;
   a nitride layer formed over the silicide region;
   an interlayer dielectric formed over the nitride layer;
   a metal contact extending through the interlayer dielectric, the nitride layer, and the silicide region and in direct contact with the doped region, wherein the metal contact comprises a low contact resistance silicide differing in composition from the silicide region and a contact stud in direct contact with the low contact resistance silicide, and the low contact resistance silicide being in direct contact with the doped region;
   a second silicide region disposed above a second doped region;
   an isolation structure between the doped region and the second doped region; and
   a second metal contact extending through the interlayer dielectric and the nitride layer, and in contact with the second silicide region, wherein
   the doped region comprises n-type semiconductor material,
   the low contact resistance silicide comprises one of Erbium and Ytterbium, and
   the second doped region comprises p-type semiconductor material.

10. The semiconductor structure of claim 1, wherein the low contact resistance silicide has a contact resistance of about 50 to 80 ohms.

11. The semiconductor structure of claim 10, wherein the low contact resistance silicide has a barrier height of about 0.25 to 0.30 eV.

12. The semiconductor structure of claim 11, wherein the low contact resistance silicide is one of Erbium and Ytterbium.

13. The semiconductor structure of claim 11, wherein the low contact resistance silicide is at a bottom of a trench formed in the interlevel dielectric and which is lined with the metal liner and filled with metal material forming the contact stud.

* * * * *